United States Patent [19]
Cho et al.

[11] Patent Number: 5,408,437
[45] Date of Patent: Apr. 18, 1995

[54] STATIC RANDOM ACCESS MEMORY

[75] Inventors: Won-Jung Cho; Kwang-Ju Choi, both of Incheon, Rep. of Korea

[73] Assignee: Samsung Electronics Co., Ltd., Suwon, Rep. of Korea

[21] Appl. No.: 235,941

[22] Filed: May 2, 1994

[30] Foreign Application Priority Data

Nov. 9, 1993 [KR] Rep. of Korea ............... 23696/1993

[51] Int. Cl.$^6$ .............................................. G11C 7/00
[52] U.S. Cl. .............................. 365/203; 365/189.01; 365/189.05
[58] Field of Search ........... 365/203, 202, 207, 189.01, 365/185, 189.05

[56] References Cited

U.S. PATENT DOCUMENTS

| | | | |
|---|---|---|---|
| 4,829,483 | 5/1989 | Ogimara | 365/203 |
| 5,202,854 | 4/1953 | Koiue | 365/203 |

Primary Examiner—Do Hyun Yoo
Assistant Examiner—Tan Nguyen
Attorney, Agent, or Firm—Charles R. Donohoe; Robert A. Westerlund, Jr.; Stephen R. Whitt

[57] ABSTRACT

The present invention relates to a static random access memory device, which has a precharge circuit for precharging bit lines to a predetermined voltage level in response to a precharge signal, a memory cell connected to a word line and bit lines for storing data, a word line selection address generating device for selecting the word line, a bit line selection address generating device for selecting the bit line, a read control circuit having a shaping circuit controlled by a read enable signal for shaping a level of the data, a latch device for latching the data of the bit line to keep a predetermined logic threshold voltage corresponding to the shaping means, and a write control circuit connected to the bit lines for supplying data to the memory cell. The latch device is provided in the read control circuit and includes NOR gates whose output signals are crossly applied. Each of the NOR gates receives data having the first logic state and data having the second logic state. The read control circuit thus latches data supplied from the bit lines, thereby accurately setting the logic threshold voltage of the inverter provided in the output terminal of the read control circuit. Accordingly, a stable operation can be performed even in low voltage and low frequency regions.

3 Claims, 3 Drawing Sheets

STATIC RANDOM ACCESS MEMORY

BACKGROUND OF THE INVENTION

The present invention relates to a semiconductor memory device, and more particularly to a data read control circuit of a static random access memory.

Essential elements for reading/writing data from/to a static random access memory include a read control circuit for receiving a read enable signal to read data and a write control circuit for receiving a write enable signal to write data. As semiconductor memory devices have become highly integrated and operating voltages have been reduced, reliability can be improved only if the read control circuit and write control circuit carry out accurate operations at high speeds.

CMOS random access memory devices include static random access memories (SRAM) and dynamic random access memories (DRAM), etc. The static random access memory uses a latch circuit for storing data, and the dynamic random access memory stores charge in a capacitor. More particularly, the structure of a static memory cell in a static random access memory device is a latch structure composed of two crossly connected inverters. That is, an output of one inverter becomes an input of the other inverter. In a write mode, data (1 or 0) is loaded on bit lines, and is stored into a memory cell by selecting a word line. To read data, after both bit lines are pre-charged, the word line is selected.

FIG. 1 illustrates a static random access memory according to the prior art.

The static random access memory shown in FIG. 1 has precharge control circuit 110 for precharging bit lines BL and $\overline{BL}$, memory cell 120 for storing predetermined data and being assigned by an X-address through word line WL connected to NMOS transistors 15 and 30, read control circuit 100 connected to bit line $\overline{BL}$ for receiving read enable signal RE to control a read operation when data is read from memory cell 120, and write control circuit 130 for receiving data supplied from a data bus in conjunction with write enable signal WE used to control a write operation when data is written to memory cell 120. Read control circuit 100 is composed of an inverter controlled by read enable signal RE for shaping the level of the outputted data. Also, the static random access memory device shown in FIG. 1 has Y-address generation circuit 95 for selecting bit line selection transistors, i.e., NMOS transistors 35 and 40 when data is read/written from/to memory cell 120. Memory cell 120 has a latch structure composed of inverters 20 and 25 and, accordingly, nodes A and B are set to data in different logic states. Write control circuit 130 has PMOS transistor 45 whose drain and source terminal are respectively connected to node N3 and power supply voltage VCC, PMOS transistor 60 whose drain and source terminals are respectively connected to node N4 and power supply voltage VCC, PMOS transistors 50 and 55 whose drain and gate terminals are crossly connected, and pull-down NMOS transistors 75 and 80 connected between drain terminals of PMOS transistors 50 and 55 and ground voltage VSS. The gate terminal of NMOS transistor 75 is connected to an output terminal of NOR gate 70, which receives data supplied from the data bus and the write enable signal inverted by inverter 65. The gate terminal of NMOS transistor 80 is connected to an output terminal of NOR gate 85, which receives an output signal of NOR gate 70 and the write enable signal inverted by inverter 65.

In the static random access device shown in FIG. 1, when the device is not in a data read mode or a data write mode, then read enable signal RE and write enable signal WE are at logic "low" states, respectively. When the read enable signal RE and the write enable signal WE keep are at "low" states, respectively, a precharge signal PCGB is at a logic "low" state. Accordingly, PMOS transistors 5 and 10 of precharge circuit 110 are turned on, and PMOS transistors 45 and 60 of write control circuit 130 are also turned on. Since the source terminals of PMOS transistors 5 and 10 of precharge circuit 110 and PMOS transistors 45 and 60 of write control circuit 130 are respectively connected to the power supply voltage, nodes N1, N2, N3 and N4 are precharged to the power supply voltage level by receiving the logic "low" state precharge signal PCGB.

If the read enable signal RE goes to a logic "high" state, i.e., if a read mode is carried out, precharge signal PCGB also becomes a logic "high" state. Accordingly, PMOS transistors 5 and 10 of precharge circuit 110 and PMOS transistors 45 and 60 of write control circuit 130 are respectively turned off. Accordingly, the potentials of nodes N1 and N2 are changed by data supplied from the memory cell 120.

Also, if write enable signal WE goes to a logic "high" state, i.e., if a write mode is carried out, precharge signal PCGB also becomes a logic "high" state. Accordingly, PMOS transistors 5 and 10 of precharge circuit 110 and PMOS transistors 45 and 60 of write control circuit 130 are respectively turned off. Accordingly, the potentials of nodes N3 and N4 are changed by data supplied from the write control circuit.

Meanwhile, those skilled in the art will readily understand that the write enable signal WE and the read enable signal RE do not go to the logic "high" state at the same time.

Here, X-address signals X0, ..., Xi supplied from X-address generation circuit 90 and Y-address signals Y0, ..., Yi supplied from Y-address generation circuit 95 maintain logic "low" states, if precharge signal PCGB is in a logic "low" state. However, if precharge signal PCGB goes to a logic "high" state, one X-address signal among X-address signals X0, ..., Xi supplied from X-address generation circuit 90 and one Y-address signal among Y-address signals Y0, ..., Yi supplied from Y-address generation circuit 95 become logic "high" states, respectively, and accordingly, only the memory cell assigned by the corresponding address signal performs the read/write operation.

The operation of an access memory according to the prior art will now be described in detail with reference to FIGS. 1 and 2.

First, the case of writing data to memory cell 120 will be described. In writing data to memory cell 120, write enable signal WE is at a logic "high" state. After nodes N1, N2, N3 and N4 are precharged to the power supply voltage level if write enable signal WE is enabled to a logic "high" state then the random access memory device goes into a write mode. When data transmitted from the data bus is at a logic "high" state, the output signal of NOR gate 70 becomes a logic "low" state and, accordingly, NMOS transistor 75 is turned off. At this time, the output signal of NOR gate 85 becomes a logic "high" state, so that NMOS transistor 80 is turned on. The potential of node N4 goes to a logic "low" state by the turn-on of NMOS transistor 80 and, accordingly, PMOS transistor 50 is turned on. The node N3 goes to a logic "high" state by the turn-on of PMOS transistor 50, so that PMOS transistor 55 is turned off. As described above, in this case one X-address signal among X-address signals X0, . . . , Xi supplied from X-address generation circuit 90 and one Y-address signal among Y-address signals supplied from Y-address generation circuit 95 become logic "high" states, respectively and, accordingly, a memory cell is assigned by the corresponding address signal. Accordingly, NMOS transistors 35 and 40 are respectively turned on, so that the logic "high" state signal having the power supply voltage level set at node N3 is dropped by threshold voltage Vth of NMOS transistor 35 and is transmitted to node N1. However, since node N1 is previously precharged to the power supply voltage level, the potential of node N1 becomes VCC-Vth after a predetermined time period elapses, as shown in the timing diagram of FIG. 2. At this time, since the potential of node N4 of write control circuit 130 keeps a logic "low" state, even passing NMOS transistor 40 does not generate a voltage drop. Accordingly, data of logic "low" state is constantly transmitted to node N2. Since logic "low" state data set at node N2 is transmitted to node B of memory cell 120 and the structure of memory cell 120 is a latch composed of inverters 20 and 25, node A is set to logic "high" state data. As a result, even if potential VCC-Vth set at node N1 is transferred to node A, node A is set to the full power supply voltage level by the operation of inverters 20 and 25. Accordingly, an accurate write operation can be performed with the memory cell 120.

When data transmitted from the data bus is in a logic "low" state, the output signal of NOR gate 70 goes to a logic "high" state and, accordingly, NMOS transistor 75 is turned on. At this time, the output signal of NOR gate 85 goes to a logic "low" state, so that NMOS transistor 80 is turned off. The potential of node N3 goes to a logic "low" state by the turn-on of NMOS transistor 75 and, accordingly, PMOS transistor 55 is turned on. The node N4 goes to a logic "high" state by the turn-on of PMOS transistor 55, so that PMOS transistor 50 is turned off. As described above, in this case one X-address signal among X-address signals supplied from X-address generation circuit 90 and one Y-address signal among Y-address signals supplied from Y-address generation circuit 95 become logic "high" states, respectively, and accordingly, a memory cell is assigned by the corresponding address signal. Accordingly, since NMOS transistors 35 and 40 are respectively turned on, the logic "high" state signal having the power supply voltage level set at node N4 is dropped by the threshold voltage Vth of NMOS transistor 40 and is transmitted to node N2. However, since node N2 is previously precharged to the power supply voltage level, the potential of node N2 becomes VCC-Vth after a predetermined time period elapses. At this time, since the potential of node N3 of write control circuit 130 is at a logic "low" state, even passing NMOS transistor 35 does not generate a voltage drop. Accordingly, the logic "low" state data is constantly transmitted to node N1. Accordingly, since logic "low" state data set at node N1 is transmitted to node A of memory cell 120, and the structure of memory cell 120 is a latch composed of inverters 20 and 25, node B is set to logic "high" state data. As a result, even if the potential VCC-Vth set at node N2 is transferred to node B, the full power supply voltage level is set to node B by the operation of inverters 20 and 25. Accordingly, an accurate write operation can be performed with memory cell 120.

The case of reading data from memory cell 120 will now be described. In reading data from memory cell 120, read enable signal RE is at a logic "high" state. After nodes N1, N2, N3 and N4 are precharged to the power supply voltage level by precharge signal PCGB of logic "low" state, if the read enable signal WE is enabled to a logic "high" state, one X-address signal among X-address signals X0, . . . , Xi supplied from the X-address generation circuit 90 and one Y-address signal among Y-address signals Y0, . . . , Yi supplied from Y-address generation circuit 95 become logic "high" states, respectively. Accordingly, data from memory cell 120 are respectively supplied to node N1 and N2 by the corresponding address signals.

First, when node A of memory cell 120 is at a logic "high" state of the power supply voltage level and node B is at a logic "low" state of the ground voltage level, data having the potential VCC-Vth dropped by the threshold voltage Vth of NMOS transistor 15 is set to node N1 by the turn-on of NMOS transistors 15 and 30, and data of logic "low" state is set to node N2. At this time, since node N1 is previously charged to the power supply voltage level, the potential VCC-Vth is set at node N1 after a predetermined time period elapses. Meanwhile, after node N3 of write control circuit 130 is charged to the logic "high" state power supply voltage level, it has a potential VCC-Vth if read enable signal RE goes to a logic "high" state and a predetermined time period elapses. Accordingly, after the logic "low" state signal set at node N4 is supplied to read control circuit 100, logic "high" state data is supplied to the data bus.

When node A of memory cell 120 is at a logic "low" state of the ground voltage level and node B is at a logic "high" state of the power supply voltage level, NMOS transistors 15 and 30 are turned on, thereby setting data of logic "low" state to node N1 and setting to node N2 data having the potential VCC-Vth dropped by the threshold voltage Vth of NMOS transistor 30. At this time, since node N2 is previously precharged to the power supply voltage level, node N2 is set to the potential VCC-Vth after a predetermined time period elapses, as shown in the timing diagram of FIG. 3. Meanwhile, after node N4 of write control circuit 130 is previously charged to a logic "high" state of power supply voltage level, it has the potential VCC-Vth, as shown in the timing diagram of FIG. 3, if read enable signal RE gpes to a logic "high" state and a predetermined time period elapses. Accordingly, the signal having the voltage level VCC-Vth set at node N4 is fed to read control circuit 100 and then logic "low" state data is supplied to the data bus. Here, if a read time, i.e., a time of enabling read enable signal RE to a logic "high" state, is lengthened, the potential set at node N4 is set to a potential VCC-Vth. At this time, when the potential of the supply voltage is in the high state, i.e., if the voltage over the logic threshold voltage corresponding to the inverter of read control circuit 100 is supplied, an accurate read operation is performed. Meanwhile, even if the potential of the supply voltage is low and the interval of keeping read enable signal RE at a logic "high" state is short, i.e., even if the read operation is ended before node N4 of write control circuit 130 is discharged to the voltage level VCC-Vth, the read operation is accurately performed.

However, in the random access memory according to the prior art shown in FIG. 1, when the potential of the supply voltage is low and the interval of keeping the read enable signal RE a logic "high" state is lengthened, i.e., if the read operation is performed in a low-voltage and low-frequency region, the voltage at node N4 is discharged to VCC-Vth during the interval of keeping read enable signal RE in a logic "high" state, thereby inaccurately setting the logic threshold voltage corresponding to the inverter of read control circuit 100. Accordingly, there is the problem of generating false operation when reading data, since the operation of inverter of the read control circuit 100 becomes unstable.

SUMMARY OF THE INVENTION

Accordingly, it is an object of the present invention to provide a static random access memory that performs stable operations in low-voltage and low-frequency regions while reading data.

It is another object of the present invention to provide a read control circuit of a static random access memory device that performs stable operation even in low-voltage and low-frequency regions.

To achieve the objects of the present invention, the static random access memory has a precharge circuit for precharging bit lines to a predetermined voltage level in response to a precharge signal, a memory cell connected to a word line and the bit lines for storing data, word line selection address generating means for selecting the word line, and bit line selection address generating means for selecting the bit line. Also, the present invention has a read control circuit which is composed of a shaping circuit controlled by a read enable signal for shaping the level of the data and latch means for latching the data of the bit line during reading data to keep a predetermined logic threshold voltage corresponding to the shaping circuit. A write control circuit connected to the bit line is provided to supply data to the memory cell. Here, the latch means of the read control circuit has NOR gates whose output signals are crossly applied. Each of the NOR gates receives data having the first logic state and data having the second logic state.

BRIEF DESCRIPTION OF THE DRAWINGS

The above objects and other advantage of the present invention will become more apparent by describing the preferred embodiment of the present invention with reference to the attached drawings, in which.

DETAILED DESCRIPTION OF THE INVENTION

Figure 1:
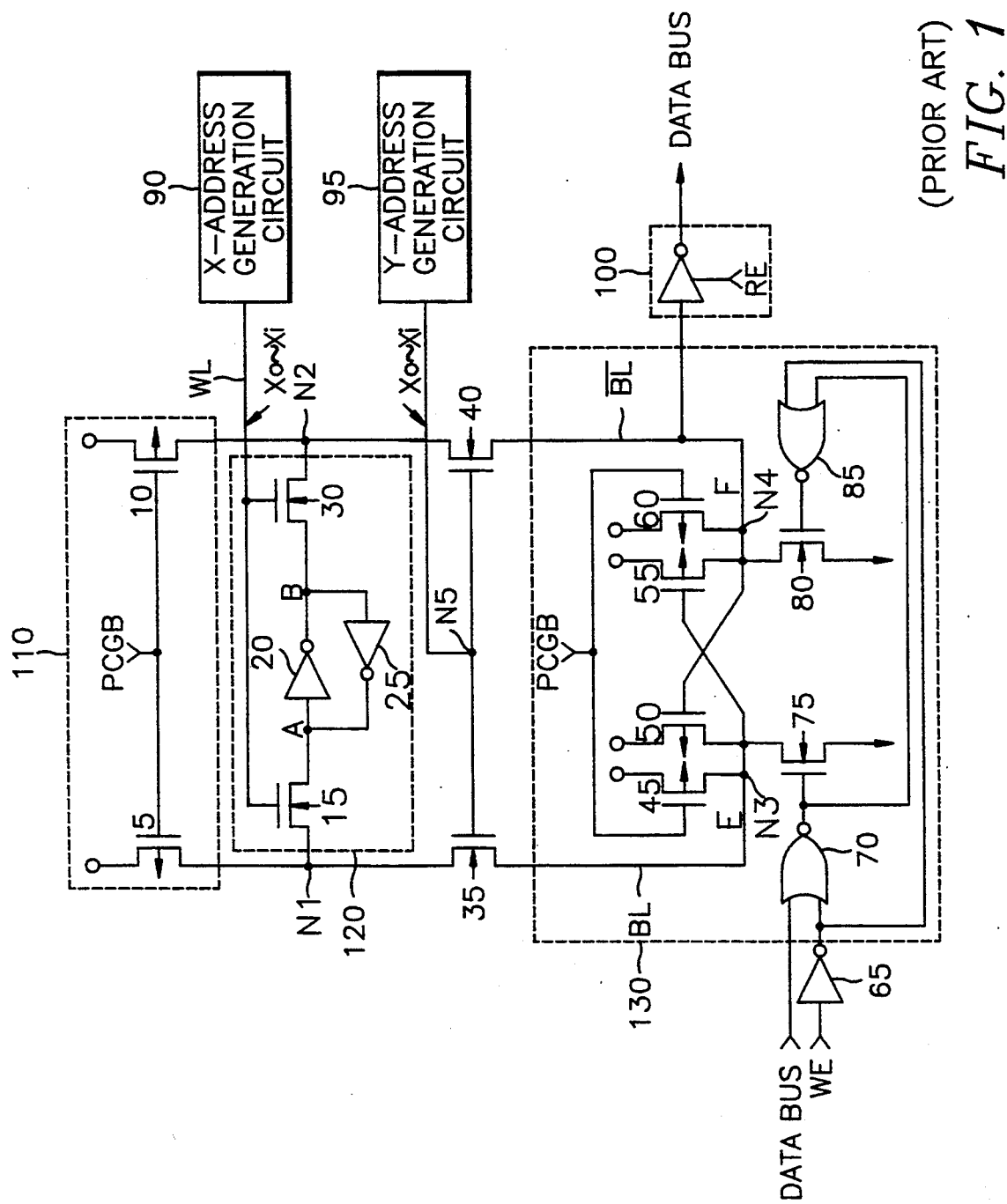
FIG. 1 is a diagram illustrating a static random access memory according to the prior art.
Figure 2:
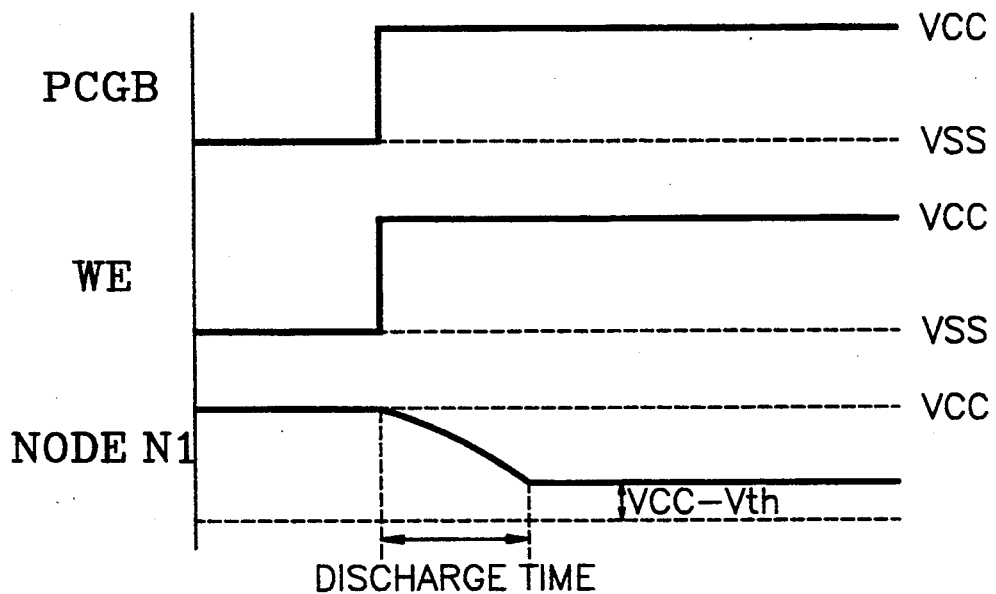
FIG. 2 is a timing diagram according to FIG. 1.
Figure 3:
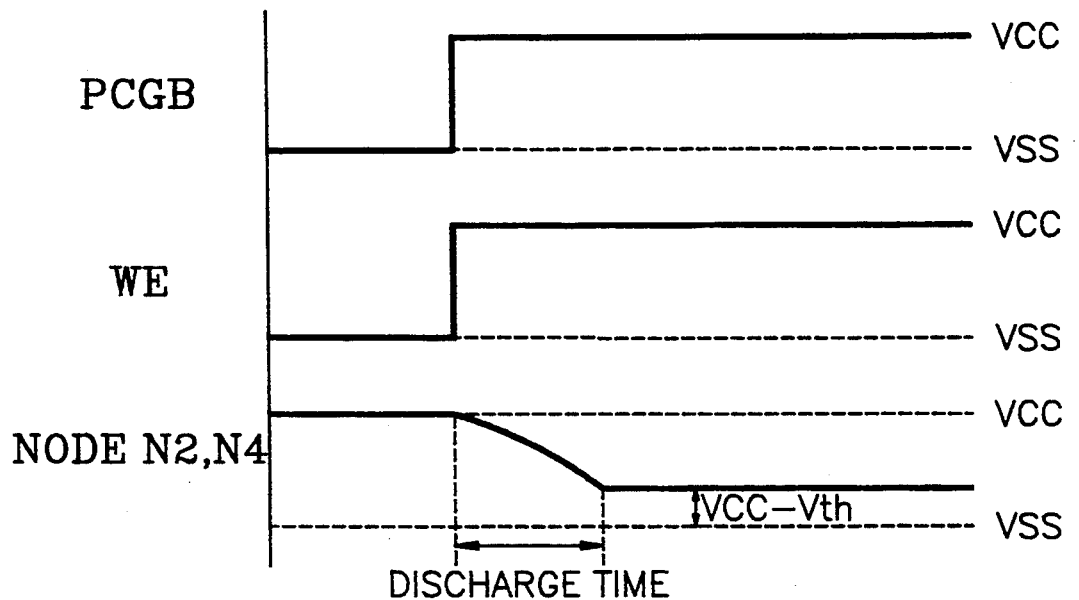
FIG. 3 is a timing diagram according to FIG. 1.

Hereinafter, the detailed description of the present invention will be described with reference to FIG. 4. For convenience, like reference numerals are used when the components in the random access memory according to the present invention are the same as the components in the random access memory according to the prior art.

Figure 4:
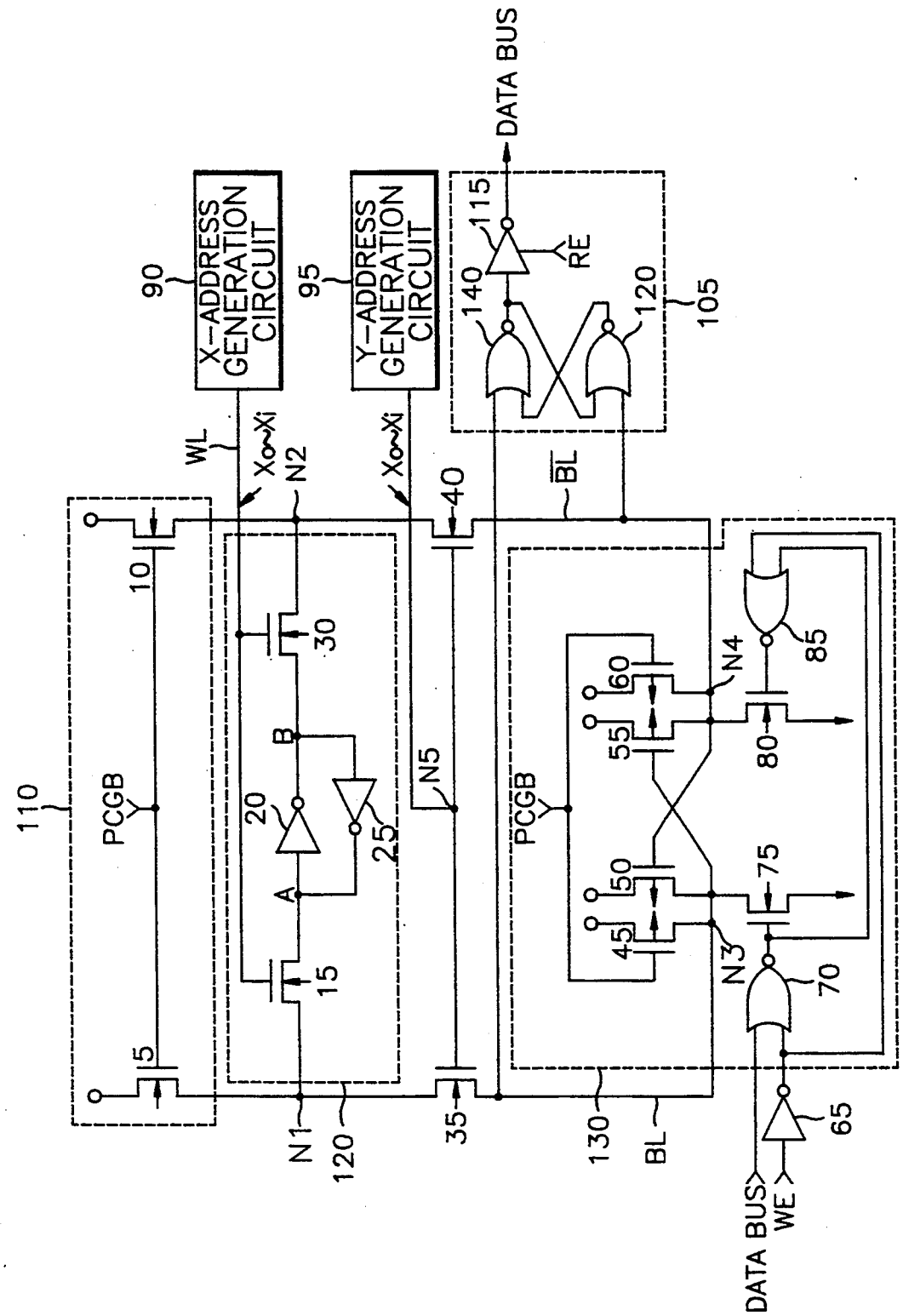
FIG. 4 is a diagram illustrating a static random access memory according to the present invention.

The static random access memory of FIG. 4 has precharge control circuit 110 for precharging bit lines BL and $\overline{BL}$, memory cell 120 for storing predetermined data and for being assigned by an X-address through word line WL connected to NMOS transistors 15 and 30, read control circuit 105 connected to bit lines BL and $\overline{BL}$ for receiving read enable signal RE to control a read operation when data is read from memory cell 120, and write control circuit 130 for receiving data supplied from a data bus and write enable signal WE to control a write operation when data is written to memory cell 120. Here, read control circuit 105 has a latch structure composed of NOR gate 140 for receiving data loaded on bit line BL and an output signal from NOR gate 120, NOR gate 120 for receiving an output signal from NOR gate 140 and data loaded on bit line $\overline{BL}$, and inverter 115 for receiving read enable signal RE and being operatively connected to NOR gates 120 and 140. Due to this latch structure, a logic threshold voltage corresponding to inverter 115 is accurately set, so that a stable read operation is performed.

It can be seen and understood that the configuration and operation of the random access memory according to the present invention are similar to the configuration and operation of the random access memory according to the prior art. Particularly, since the data write operation of the random access memory according to the present invention is the same as that of the conventional art the detailed description will be omitted.

In the read operation of the random access memory according to the present invention, reading data from memory cell 120 will now be described. When data is read from memory cell 120, read enable signal RE is at a logic "high" state. After nodes N1, N2, N3 and N4 are precharged to a power supply voltage level by precharge signal PCGB being kept in logic "low" state, if read enable signal RE is enabled to a logic "high" state, one X-address signal among X-address signals X0, . . . , Xi supplied from X-address generation circuit 90 and one Y-address signal among Y-address signals Y0, . . . , Yi supplied from Y-address generation circuit 95 become logic "high" states, respectively. Accordingly, data are respectively supplied to nodes N1 and N2 from memory cell 120 by the corresponding address signals.

When node A of memory cell 120 is at a logic "low" state of a ground voltage level and node B is at a logic "high" state of a power supply voltage level, i.e., when the data of memory cell 120 is at a logic "low" state, NMOS transistors 15 and 30 are turned on and, accordingly, node N1 is set to the data logic "low" state and node N2 is set to data having a potential VCC-Vth dropped by the threshold voltage Vth of NMOS transistor 30. At this time, since node N2 is previously precharged to the power supply voltage level, it is set to the potential VCC-Vth after a predetermined time period elapses. Meanwhile, after node N4 of write control circuit 130 is charged to a logic "high" state of the power supply voltage level, it has the potential VCC-Vth if read enable signal RE becomes a logic "high" state and a predetermined time period elapses. Meanwhile, after node N3 is charged to a logic "high" state of the power supply voltage level, it keeps a logic "low" state if read enable signal RE becomes a logic "high" state.

However, when nodes N3 and N4 maintain logic "high" states, read enable signal RE is enabled to a logic "high" state. That is, when a logic "high" state signal set at node N4 is fed to NOR gate 120 of read control circuit 105 and a logic "high" state signal set at node N3 is fed to NOR gate 140, read enable signal RE is enabled to a logic "high" state and, accordingly, node N3 becomes a logic "low" state. Accordingly, since a logic "low" state signal of node N3 and a logic "low" state output signal of NOR gate 120 are fed to NOR gate 140, the output of NOR gate 140 becomes a logic "high" state. Accordingly, since the signal of node N4 and the logic "high" state output signal of NOR gate 140 are fed to NOR gate 120, the output of NOR gate 120 always keeps a logic "low" state according to the characteristic of NOR gates if one input becomes logic "high" state. Accordingly, even if the voltage of node N4 is lowered to VCC-Vth after a predetermined time period, the logic state of the output signal of NOR gate 120 remains unchanged. Accordingly, the signal fed to inverter 115 of read control circuit 105 is accurately set to the logic threshold voltage corresponding to inverter 115, so that a stable read operation is performed.

When node A of memory cell 120 is set to a logic "high" state of power supply voltage level and node B is set to a logic "low" state of ground voltage level, i.e., when cell data of memory cell 120 is in logic "high" state, NMOS transistors 15 and 30 are turned on and, accordingly, node N1 is set to data having the potential VCC-Vth dropped by the threshold voltage of NMOS transistor 15 and node N2 is set to data of logic "low" state. Here, since node N1 is previously precharged to the power supply voltage level, it is set to the potential VCC-Vth after a predetermined time period elapses. Meanwhile, after node N3 of write control circuit 130 is charged to logic "high" state of the power supply voltage level, it has a potential VCC-Vth, if read enable signal RE becomes logic "high" state and a predetermined time period elapses. Meanwhile, after node N4 is charged to a logic "high" state of power supply voltage level, it keeps a logic "low" state if the read enable signal becomes a logic "high" state.

However, when nodes N3 and N4 keep logic "high" states, read enable signal RE is enabled to a logic "high" state. That is, while a logic "high" state signal set at node N4 is fed to NOR gate 120 of read control circuit 105 and a logic "high" state signal set at node N3 is fed to NOR gate 140, read enable signal RE is enabled to a logic "high" state and, accordingly, node N4 becomes a logic "low" state. Accordingly, since a logic "low" state signal of node N4 and a logic "low" state output signal of NOR gate 140 are fed to NOR gate 120, the output of NOR gate 120 becomes a logic "high" state. Accordingly, since the signal of node N3 and the logic "high" state output signal of NOR gate 120 are fed to NOR gate 140, the logic state of the output signal of NOR gate 140 remains unchanged even if the voltage is lowered to VCC-Vth after a predetermined time period elapses. The reason is that the output of a NOR gate always keeps logic "low" state according to NOR gate characteristics if one input becomes a logic "high" state. Accordingly, the signal fed to inverter 115 of read control circuit 105 is accurately set to the logic threshold voltage corresponding to inverter 115, so that the stable read operation can be performed.

The present invention can be implemented in various embodiments within the scope of the present invention. Particularly, it can be easily understood to those skilled in the art that in a read control circuit, NOR gates 110 and 120 having as inputs the data of first logic state and the data of second logic state and crossly receiving their output signals can be variously implemented.

As described above, according to the present invention, the read control circuit of the random access memory latches data supplied from bit lines, thereby accurately setting the logic threshold voltage corresponding to the inverter provided at the output terminal of the read control circuit. Accordingly, the stable operation can be performed even in low-voltage and low-frequency regions.

What is claimed is:

1. A static random access memory device comprising:
   precharge circuit means for precharging bit lines to a predetermined voltage level in response to a precharge signal;
   a memory cell connected to a word line and said bit lines for storing data;
   word line selection address generating means for selecting said word line;
   bit line selection address generating means for selecting said bit line;
   read control circuit means comprising: shaping means controlled by a read enable signal for shaping a level of said data; and latch means connected to said bit lines for latching said data of said bit lines during reading data to keep a predetermined logic threshold voltage corresponding to said shaping means; and
   write control circuit means connected to said bit lines for supplying said data to said memory cell.

2. A static random access memory device as claimed in claim 1, wherein said shaping means comprises an inverter.

3. A static random access memory device as claimed in claim 1, wherein said latch means comprises NOR gates of which the output signals are being crossly applied, each of said NOR gates receiving said data having a first logic state and a second logic state.

* * * * *